US009171801B2

(12) United States Patent
Bao et al.

(10) Patent No.: US 9,171,801 B2
(45) Date of Patent: Oct. 27, 2015

(54) E-FUSE WITH HYBRID METALLIZATION

(71) Applicant: International Business Machines Corporation, Armonk, NY (US)

(72) Inventors: Junjing Bao, San Diego, CA (US); Griselda Bonilla, Fishkill, NY (US); Samuel S. Choi, Hopewell Junction, NY (US); Ronald G. Filippi, Wappingers Falls, NY (US); Naftali E. Lustig, Croton on Hudson, NY (US); Andrew H. Simon, Fishkill, NY (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 0 days.

(21) Appl. No.: 14/291,027

(22) Filed: May 30, 2014

(65) Prior Publication Data

US 2014/0332924 A1   Nov. 13, 2014

Related U.S. Application Data

(63) Continuation-in-part of application No. 14/024,694, filed on Sep. 12, 2013, and a continuation-in-part of application No. 13/890,642, filed on May 9, 2013.

(51) Int. Cl.
*H01L 23/525*   (2006.01)
*H01L 23/532*   (2006.01)
*H01L 23/29*   (2006.01)

(52) U.S. Cl.
CPC ........ *H01L 23/5256* (2013.01); *H01L 23/5329* (2013.01); *H01L 23/53271* (2013.01); *H01L 23/53295* (2013.01); *H01L 23/53223* (2013.01); *H01L 23/53238* (2013.01); *H01L 23/53266* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,707,723 A | 11/1987 | Okamoto et al. | |
| 4,962,060 A | 10/1990 | Sliwa et al. | |
| 5,208,170 A | 5/1993 | Kobeda et al. | |
| 5,223,456 A | 6/1993 | Malwah | |

(Continued)

FOREIGN PATENT DOCUMENTS

| | | |
|---|---|---|
| CN | 102593098 A | 7/2012 |
| EP | 0704883 A2 | 4/1996 |
| WO | 2011146128 A1 | 11/2011 |

OTHER PUBLICATIONS

Authors: Disclosed Anonymously, IP.com Number: IPCOM000223293D, Publication Date: Nov. 15, 2012, Title: "Hybrid refractory metal-copper wiring metallization scheme for integrated circuits".

(Continued)

*Primary Examiner* — Steven Loke
*Assistant Examiner* — Juanita B Rhodes
(74) *Attorney, Agent, or Firm* — Catherine Ivers; Roberts Mlotkowski Safran & Cole, P.C.

(57) ABSTRACT

A structure including a first interconnect including a first line overlying a first via and a second interconnect including a second line overlying a second via. The first line and the second line are co-planar. The first interconnect comprises a first conductor, the first conductor comprises a metal silicide including titanium silicide, cobalt silicide, nickel silicide, tungsten silicide, platinum silicide, molybdenum silicide, tantalum silicide, or some combination thereof. The second interconnect comprises a second conductor, the second conductor comprising copper.

16 Claims, 11 Drawing Sheets

(56) References Cited

U.S. PATENT DOCUMENTS

| | | | |
|---|---|---|---|
| 5,300,813 A | 4/1994 | Joshi et al. | |
| 5,439,731 A | 8/1995 | Li et al. | |
| 5,470,788 A | 11/1995 | Biery et al. | |
| 5,976,975 A | 11/1999 | Joshi et al. | |
| 6,181,013 B1 | 1/2001 | Liu et al. | |
| 6,245,996 B1 | 6/2001 | Atakov et al. | |
| 6,294,464 B1 | 9/2001 | Trivedi | |
| 6,319,819 B1* | 11/2001 | Besser et al. | 438/633 |
| 6,376,358 B1 | 4/2002 | Fischer et al. | |
| 6,426,544 B1 | 7/2002 | Ryan et al. | |
| 6,566,242 B1 | 5/2003 | Adams et al. | |
| 6,597,067 B1 | 7/2003 | Biery et al. | |
| 6,678,951 B2 | 1/2004 | Atakov et al. | |
| 6,680,514 B1 | 1/2004 | Geffken et al. | |
| 6,975,032 B2 | 12/2005 | Chen et al. | |
| 7,115,999 B2 | 10/2006 | Tsumura et al. | |
| 7,259,463 B2 | 8/2007 | Huang et al. | |
| 7,307,344 B2 | 12/2007 | Minamihaba et al. | |
| 7,572,682 B2 | 8/2009 | Yang et al. | |
| 7,629,264 B2 | 12/2009 | Bonilla et al. | |
| 7,737,026 B2 | 6/2010 | Li et al. | |
| 7,745,810 B2 | 6/2010 | Rueckes et al. | |
| 7,790,617 B2 | 9/2010 | Lim et al. | |
| 7,851,357 B2 | 12/2010 | Cabral, Jr. et al. | |
| 7,923,283 B2 | 4/2011 | Awano | |
| 7,989,956 B1 | 8/2011 | Zhai et al. | |
| 8,056,039 B2 | 11/2011 | Chanda et al. | |
| 8,101,505 B2 | 1/2012 | Abou-Khalil et al. | |
| 8,138,603 B2 | 3/2012 | Hsu et al. | |
| 8,211,776 B2 | 7/2012 | Horak et al. | |
| 8,232,646 B2 | 7/2012 | Bonilla et al. | |
| 8,237,142 B2 | 8/2012 | Cheung et al. | |
| 8,647,978 B1 | 2/2014 | Ott et al. | |
| 2002/0145201 A1* | 10/2002 | Armbrust et al. | 257/776 |
| 2005/0189613 A1 | 9/2005 | Otsuka et al. | |
| 2007/0023914 A1 | 2/2007 | Farrar | |
| 2007/0045772 A1* | 3/2007 | Cheng et al. | 257/529 |
| 2007/0063313 A1 | 3/2007 | Barth et al. | |
| 2007/0252237 A1 | 11/2007 | Ko et al. | |
| 2008/0296728 A1* | 12/2008 | Yang et al. | 257/530 |
| 2009/0057818 A1* | 3/2009 | Kim et al. | 257/529 |
| 2009/0206978 A1 | 8/2009 | Hwang et al. | |
| 2010/0021708 A1 | 1/2010 | Kong et al. | |
| 2010/0032797 A1 | 2/2010 | Takewaki | |
| 2010/0224956 A1 | 9/2010 | Kim et al. | |
| 2011/0006425 A1 | 1/2011 | Wada et al. | |
| 2011/0057322 A1 | 3/2011 | Matsunaga et al. | |
| 2011/0059599 A1 | 3/2011 | Ward et al. | |
| 2011/0076390 A1* | 3/2011 | Cerio et al. | 427/96.8 |
| 2011/0091647 A1 | 4/2011 | Colombo et al. | |
| 2011/0115094 A1 | 5/2011 | Darnon et al. | |
| 2011/0175226 A1 | 7/2011 | Bonilla et al. | |
| 2011/0298132 A1 | 12/2011 | Naeemi et al. | |
| 2011/0309507 A1 | 12/2011 | Darnon et al. | |
| 2012/0058350 A1 | 3/2012 | Long et al. | |
| 2012/0080796 A1 | 4/2012 | Wada et al. | |
| 2012/0104622 A1 | 5/2012 | Kim et al. | |
| 2012/0126363 A1 | 5/2012 | Wang et al. | |
| 2012/0139114 A1 | 6/2012 | Zhang et al. | |
| 2012/0181692 A1 | 7/2012 | Heinrich et al. | |
| 2012/0196434 A1 | 8/2012 | Thei et al. | |
| 2013/0026635 A1 | 1/2013 | Yang et al. | |
| 2013/0147008 A1 | 6/2013 | Poppe et al. | |
| 2013/0214252 A1 | 8/2013 | Park et al. | |

OTHER PUBLICATIONS

Wall et al., "A New Four-Level Metal Interconnect System Tailored to an Advanced 0.5-um BiCMOS Technology", IEEE Transactions on Semiconductor Manufacturing, vol. 11, No. 4, Nov. 1998, pp. 624-635.

Hey et al., "Selective Tungsten on Aluminum for Improved VLSI Interconnects", 1986 IEEE, pp. IEDM 86-50-IEDM 86-53.

Li et al., "Low-Temperature Growth of Graphene by Chemical Vapor Deposition Using Solid and Liquid Carbon Sources", vol. 5, No. 4, 2011, ACSNANO, www.acsnano.org., published Mar. 25, 2011, pp. 3385-3390.

Mattevi et al., "A review of chemical vapour deposition of graphene on copper", Journal of Materials Chemistry, vol. 21, 2011, pp. 3324-3334.

Xia et al., "The origins and limits of metal—graphene junction resistance", Nature Nanotechnology, vol. 6, Mar. 2011, www.nature.com/naturenanotechnology, pp. 179-184.

Inohara et al., "Copper Filling Contact Process to Realize Low Resistance and Low Cost Production Fully Compatible to SOC Devices", 2001 IEEE, IEDM 01-931-IEDM 01-933.

Li et al., "Bottom-up approach for carbon nanotube interconnects", Applied Physics Letters, vol. 82, No. 15, Apr. 14, 2003, 2003 American Institute of Physics, pp. 2491-2493.

Paul et al., Synthesis of a Pillared Graphene Nanostructure: A Counterpart of Three-Dimensional Carbon Architectures, small 2010, vol. 6, No. 20, pp. 2309-2313, © 2010 Wiley-VCH Verlag GmbH & Co. KGaA, Weinheim, wileyonlinelibrary.com.

Bao et al., U.S. Appl. No. 13/890,642, filed May 9, 2013, entitled "High Performance Refractory Metal/Copper Interconnects to Eliminate Electromigration".

Filippi et al., U.S. Appl. No. 14/024,694, filed Sep. 12, 2013, entitled "E-Fuse With Hybrid Metallization".

Pending U.S. Appl. No. 14/480,718, entitled: "Multimetal Interlayer Interconnects", filed Sep. 9, 2014, 27 pages.

Sun et al., "Surface and grain-boundary scattering in nanometric Cu films", Physical Review B 81, 155454 (2010), DOI: 10.1103/PhysRevB.81.155454, pp. 155454-1-155454-12, The American Physical Society.

Filippi et al., "Interconnect with hybrid metallization," U.S. Appl. No. 13/890,560, filed May 9, 2013.

Bao et al., "Hybrid Graphene-Metal Interconnect Structures", U.S. Appl. No. 13/873,356, filed Apr. 30, 2013.

* cited by examiner

E-FUSE WITH HYBRID METALLIZATION

CROSS REFERENCE

The present application is a continuation-in-part of and claims priority under 35 U.S.C. §120 of U.S. patent application Ser. No. 14/024,694, filed on Sep. 12, 2013, which is a continuation-in-part of and claims priority under 35 U.S.C. §120 of U.S. patent application Ser. No. 13/890,642, filed on May 9, 2013, both of which are herein incorporated by reference in their entirety.

BACKGROUND

The present invention generally relates to metallization structures for integrated circuits on a semiconductor chip. In particular, the invention relates to interconnects with superior electromigration (herein "EM") resistance, these interconnects include a high conductivity interconnect portion abutting a metal silicide interconnect portion.

Metallization systems used in integrated circuits on a semiconductor chip include several levels of metal lines separated by dielectric layers and connected through the dielectric layers by metal vias.

Voids can appear in the metal lines and vias due to electromigration of the metal atoms. Electromigration is the movement of atoms due to a high electric current density. Atoms will move in one direction, while vacancies (empty atomic sites) move in the opposite direction. The result is accumulation of vacancies which form void(s) in the metal line or via and an accumulation of atoms which may form a hillock (a protrusion a metal atoms).

In older, less advanced technologies, metal lines are made of aluminum and the electromigration issue is addressed by making lines above a certain size (thereby minimizing current density) and sandwiching the aluminum line with a titanium layer to form a titanium-aluminum alloy which is resistance to atomic and vacancy flux.

In newer, more advanced technologies, metal lines are made of copper. As metal lines shrink, electromigration is once again emerging as a concern. Initially, electromigration was addressed by grain size engineering, namely growing large bamboo grains. The grain structure forces atomic and vacancy migration to the metal line/dielectric interface. Therefore, similar to the aluminum lines, alloys (CuMn, for example) are being proposed for the copper metal line/dielectric interface to impede migration. However, merely alloying may not be sufficient as interconnect features continue to shrink in size and grow in number. In addition, with shrinking line widths, the volume of copper in the line shrinks which limits the current carrying capability of narrow lines. Thus, a more robust solution to electromigration in narrow lines which does not detract from the current carrying capabilities of the lines is desirable.

SUMMARY

According to one embodiment of the present invention, a structure is provided. The structure may include a first interconnect including a first line overlying a first via and a second interconnect including a second line overlying a second via. The first line and the second line are co-planar. The first interconnect comprises a first conductor, the first conductor comprises a metal silicide including titanium silicide, cobalt silicide, nickel silicide, tungsten silicide, platinum silicide, molybdenum silicide, tantalum silicide, or some combination thereof. The second interconnect comprises a second conductor, the second conductor comprising copper.

According to another embodiment, a method of forming a hybrid structure is provided. The method may include forming a first opening in a dielectric, the first opening including a first line opening in communication with a first via opening, lining the first opening with a first liner, and filling the first opening with a first conductor, the first conductor comprises a metal silicide including titanium silicide, cobalt silicide, nickel silicide, tungsten silicide, platinum silicide, molybdenum silicide, tantalum silicide, or some combination thereof. The method may further include planarizing the first conductor and first liner to be co-planar with the dielectric, forming a second opening in the dielectric, the second opening including a second line opening in communication with a second via opening, and lining the second opening with a second liner. The method may further include filling the second line and via opening with a second conductor, the second conductor comprising copper, and planarizing the second conductor and second liner to be co-planar with the dielectric, the first conductor, and the first liner.

According to another embodiment, a method of forming a hybrid interconnect structure is provided. The method may include forming a first damascene line of a first conductor, the first damascene line having a first line width, the first conductor comprises a metal silicide including titanium silicide, cobalt silicide, nickel silicide, tungsten silicide, platinum silicide, molybdenum silicide, tantalum silicide, or some combination thereof; and forming a second damascene line of a second conductor, the second damascene line having a second line width, the second conductor comprising copper. The first damascene line width is less than the second damascene line width.

BRIEF DESCRIPTION OF THE SEVERAL VIEWS OF DRAWINGS

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The basic principle of the invention includes methods of making a hybrid interconnect structures. The methods result in structures which have a first interconnect (including a first line and first via), a second interconnect (including a second line and a second via), preferably in the same level and co-planar. The first interconnect is made of a first conductor material and the second interconnect is made of a second conductor material. The first line and the second line have different widths and may have different heights and aspect ratios. The first and second lines may directly contact each other.

Figure 1:
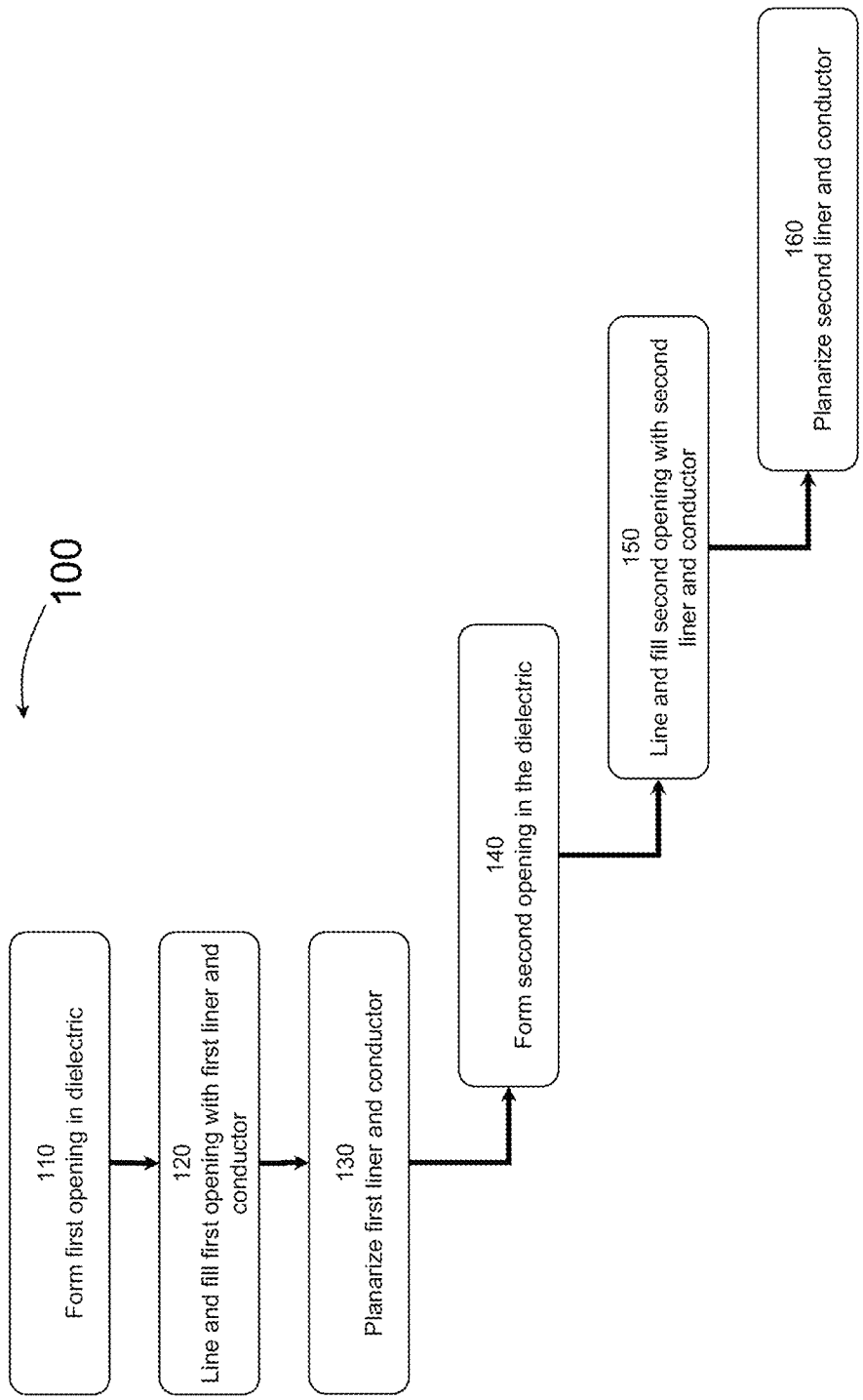
FIG. 1 is a flow chart 100 of the steps of forming a hybrid interconnects structure according to one embodiment of the present invention.

FIG. 1 is a flow chart 100 of the steps of forming a hybrid interconnects structure according to a preferred embodiment. Step 110 is forming a first opening in a dielectric; step 120 is lining and filling the first opening with a first liner and first conductor; step 130 is planarizing the first liner and first conductor; step 140 forming a second opening in the dielectric; step 150 is lining and filling the second opening with a second liner and second conductor; step 160 is planarizing the second liner and second conductor. Each of the steps, and the resulting structures, will be discussed in detail below.

Figure 2:
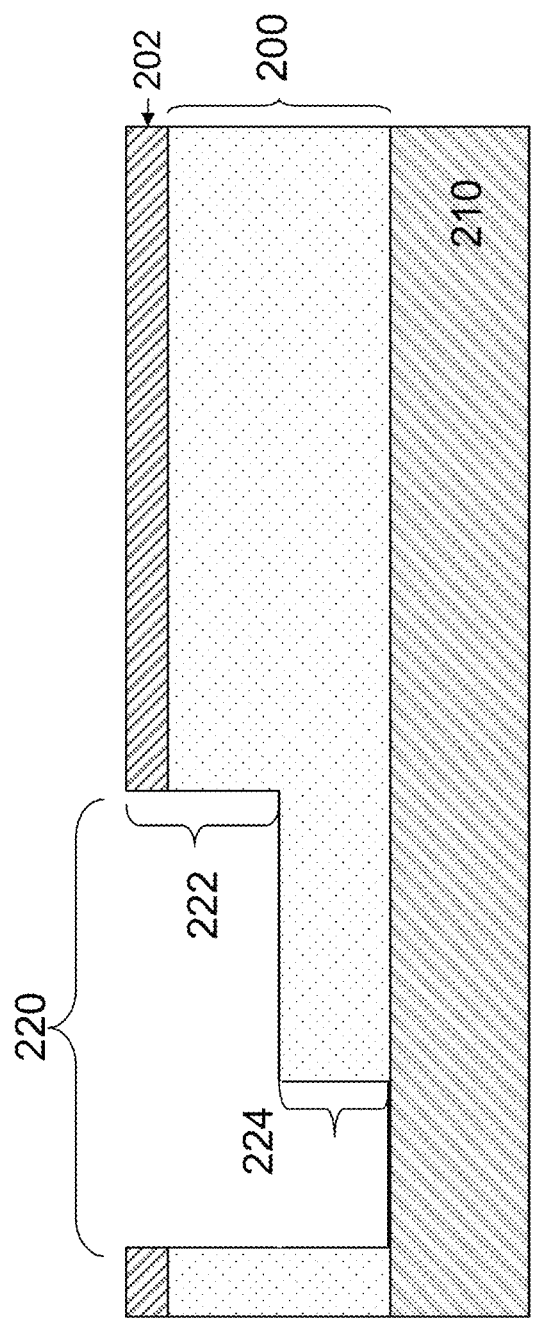
FIG. 2 illustrates, in cross section, forming a first opening in a dielectric according to an embodiment of the present invention.

FIG. 2 is a cross section illustration of forming a first opening in a dielectric according to an embodiment. A dielectric layer 200 is over substrate 210. Using standard lithography and reactive ion etching (herein "RIE") techniques a first interconnect opening 220 including a first via opening 224 and first line opening 222 is formed in the dielectric 200. The substrate 210, in most cases, is a preceding interconnection level of the device. However, the substrate can also be a contact level of a device or any prior surface which requires interconnects above it. The dielectric 200 can be any dielectric layer or more likely a combination of dielectric layers. In a preferred embodiment, the dielectric layer is a low dielectric constant material above a dielectric cap layer which may also function as an etch stop. By way of example and not limitation, the dielectric cap layer may include silicon and nitrogen containing materials or silicon and carbon containing materials or combinations thereof; for example silicon nitride ($Si_3N_4$), silicon carbide (SiC), silicon carbon nitride (SiCN) or hydrogenated silicon carbide (SiCH). Low dielectric constant materials are those with dielectric constant less than 4 and preferably less than 3.6. By way of example and not limitation, low dielectric constant materials include silicon-carbon-oxygen containing materials such as hydrogenated silicon carbon oxide (SiCOH), porous dielectric materials such as porous SiCOH, or organic materials. In yet another embodiment, the dielectric layer 200 includes a silicon and oxygen containing material having a dielectric constant around 4. FIG. 2 also illustrates a preferred, but not required, embodiment having a hardmask 202 above the dielectric 200. The hardmask 202 can include a single layer or multiple layers. In a preferred embodiment, hardmask 202 can act as a polish stop and/or an etch stop. In a preferred embodiment, the hardmask includes a silicon dioxide film, preferably from a TEOS precursor. The first via opening 224 and first line opening 222 can be formed in a via first or a via last process.

Figure 3:
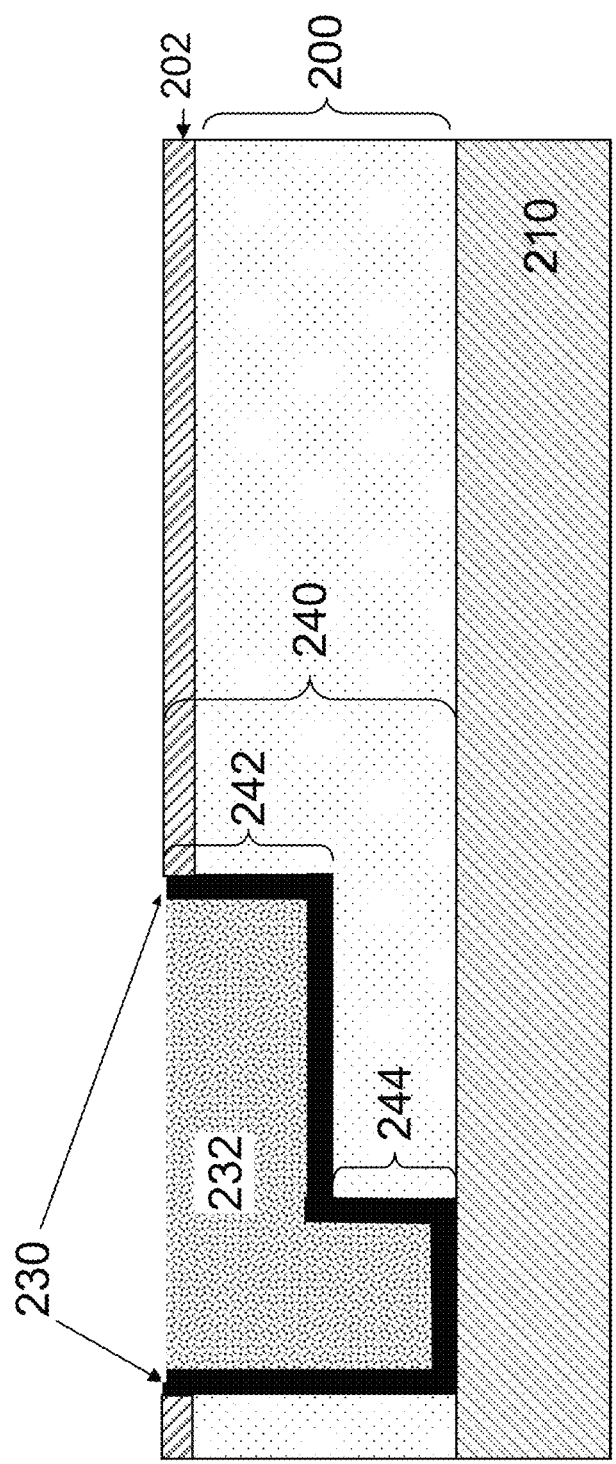
FIG. 3 illustrates, in cross section, lining, filling and planarizing the first liner and first conductor in the dielectric to form the first interconnect according to an embodiment of the present invention.

FIG. 3 is a cross section illustration after depositing and planarizing the first liner 230 and first conductor 232 in the dielectric 200 to form the first interconnect 240. In a preferred embodiment, chemical mechanical polishing is the planarization method, in such a case, hardmask 202 can act as a polish stop. The first interconnect 240 includes a first line 242 portion (former first line opening 222) and a first via 244 portion (former first via opening 224). The first liner 230 lines the former first line opening 222 and first via opening 224 and is in contact with dielectric 200. The first liner 230 can comprise one or more layers. The first liner 230 should perform at least one of the following functions: promote adhesion of the dielectric 200 and first conductor 232, and should prevent diffusion from the first conductor 232 to the dielectric 200 or vice versa. Thus, the identity of the first liner 230 can vary with the identity of the first conductor 232.

In an embodiment, the first conductor 232 may include a refractory metal. Refractory metals include tungsten, niobium, molybdenum, tantalum or rhenium. The following elements are also sometimes considered refractory metals: titanium, vanadium, chromium, hafnium, ruthenium, zirconium, osmium, rhodium and iridium. Alternatively, first conductor 232 could be manganese nitride or cobalt. First conductor 232 may be an alloy of one of the previously mentioned materials. In a preferred embodiment, the first conductor 232 includes tungsten and the first liner 230 includes titanium and/or titanium nitride layer(s).

In an alternative embodiment, the first conductor 232 may include a metal silicide. Examples of metal silicides include, titanium silicide, cobalt silicide, nickel silicide, tungsten silicide, or some combination thereof. Additional examples of metal silicides may include platinum silicide, molybdenum silicide, tantalum silicide or some combination thereof.

The first conductor 232 may be an alloy of one of the previously mentioned materials. In an embodiment, the first conductor 232 may include a tungsten silicide and the first liner 230 may include a titanium layer, a titanium nitride layer, or both. The metal silicides may generally have low resistance and good processing compatibility with typical semiconductor processing, such as, their ability to withstand high process temperatures, oxidizing ambients, and various chemical cleaning and etching techniques. In addition, metal silicides may be easy to etch using a typical dry etching technique and may not be particularly susceptible to the effects of electromigration.

Metal silicides may be particularly advantageous in narrow features, such as, narrow metal lines or wires. Generally, narrow features made from copper may have limited current carrying ability, limited lifetime due to electromigration, and relatively high resistance due to the narrow dimensions and size effect phenomena. Alternatively, narrow features made from a metal silicide may generally have improved current carrying ability, very good resistance to electromigration, and relatively low resistance as compared to similar sized feature made from copper. As such, narrow features made from metal silicides are thought to be more reliable than narrow features made from copper. Therefore, it may be advantageous to fabricate narrow features from a metal silicide and fabricate wider features from conventional copper thereby improving the reliability of relatively narrow features while simultaneously maintaining low resistance of relatively wider features. For purposes of this description a relatively narrow features may have a width equal to or less than 25 nm.

In embodiments where the first conductor 232 is a metal silicide a variety of processing techniques may be used, including, for example, single or dual damascene processing, as described above. Alternatively, a subtractive etch technique may be used to fabricate the first line portion 242 above the pre-existing first via portion 244. In such cases, the first via portion 244 may be fabricated before the first line portion 242. As is known in the art, a subtractive etching technique may include the known steps of first forming a blanket layer of the metal silicide subsequently followed by removing any unwanted portion of the metal silicide using standard lithography followed by a subtractive etch. In an embodiment, the first via portion 244 of the first interconnect 240 may be tungsten and the first line portion 242 of the first interconnect 240 may include one of the metal silicides disclosed above.

Figure 4:
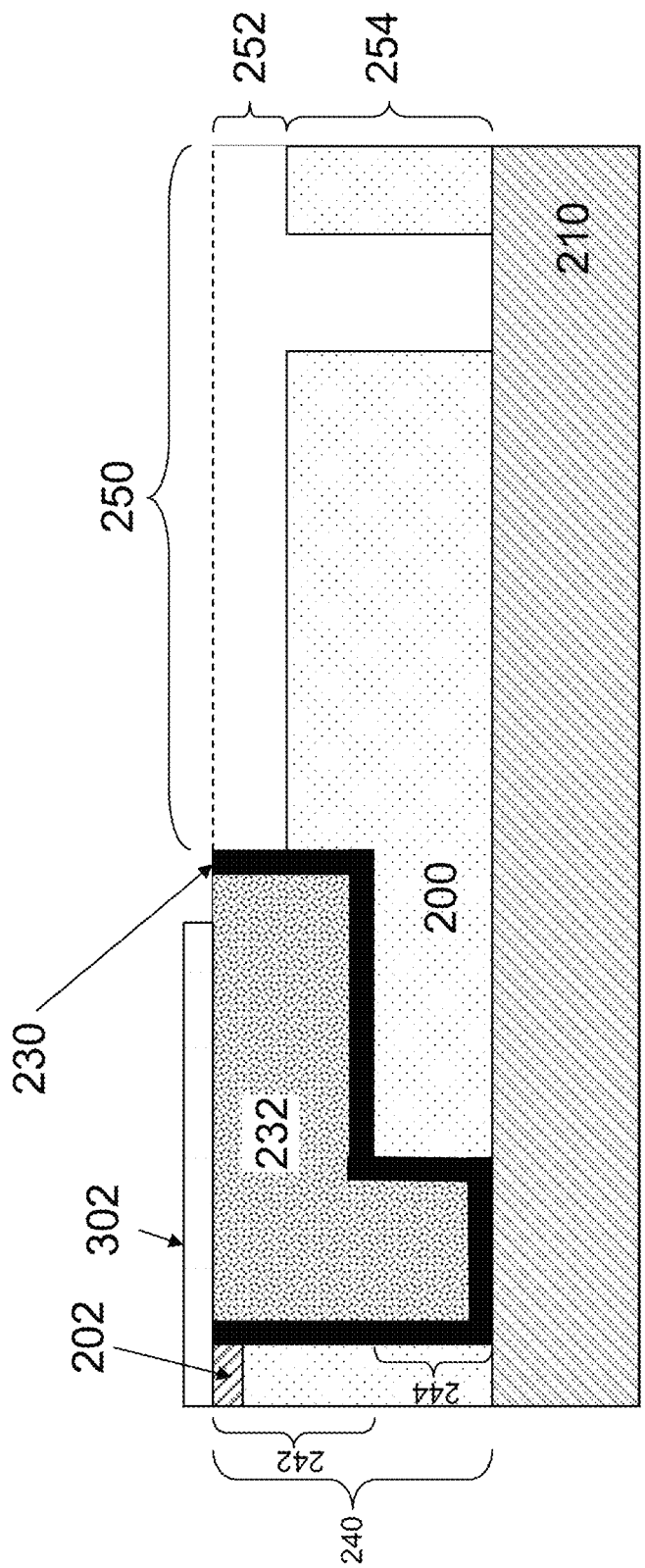
FIG. 4 illustrates, in cross section, forming a second opening in the dielectric according to an embodiment.

FIG. 4 is a cross section illustration of forming a second opening in the dielectric prior to second metallization according to an embodiment. The second interconnect opening 250 includes a second via opening 254 and second line opening 252 formed in the dielectric 200. The second via opening 254 and second line opening 252 can be formed in a via first or a via last process. The embodiment shown in FIG. 4 was made in a via last process. In a via last process line hardmask 302 is formed over the entire substrate and opened in areas where the second line opening 252 in the dielectric 200 will be. The line hardmask 302 can include one or more dielectric or conducting films or combinations thereof. By way of example and not limitation, line hardmask may include silicon dioxide, silicon nitride, tantalum, tantalum nitride, titanium, titanium carbide, or titanium nitride. As seen in FIG. 4, sometimes the opening in the line hardmask 302 overlaps with the first line 242 portion, such that a region of first line portion 242 adjacent second line opening 252 is not covered by the line hardmask 302. In such a situation, while not illustrated in FIG. 4, a top corner of the first line portion 242 adjacent second interconnection opening 250 (and in particular, adjacent to second line opening 252) can be faceted as result of the second line opening etch. Thus, a portion of first liner 230 may be missing or reduced in this region. In addition, a portion of first conductor 232 may be missing or reduced in the faceted region.

Figure 5:
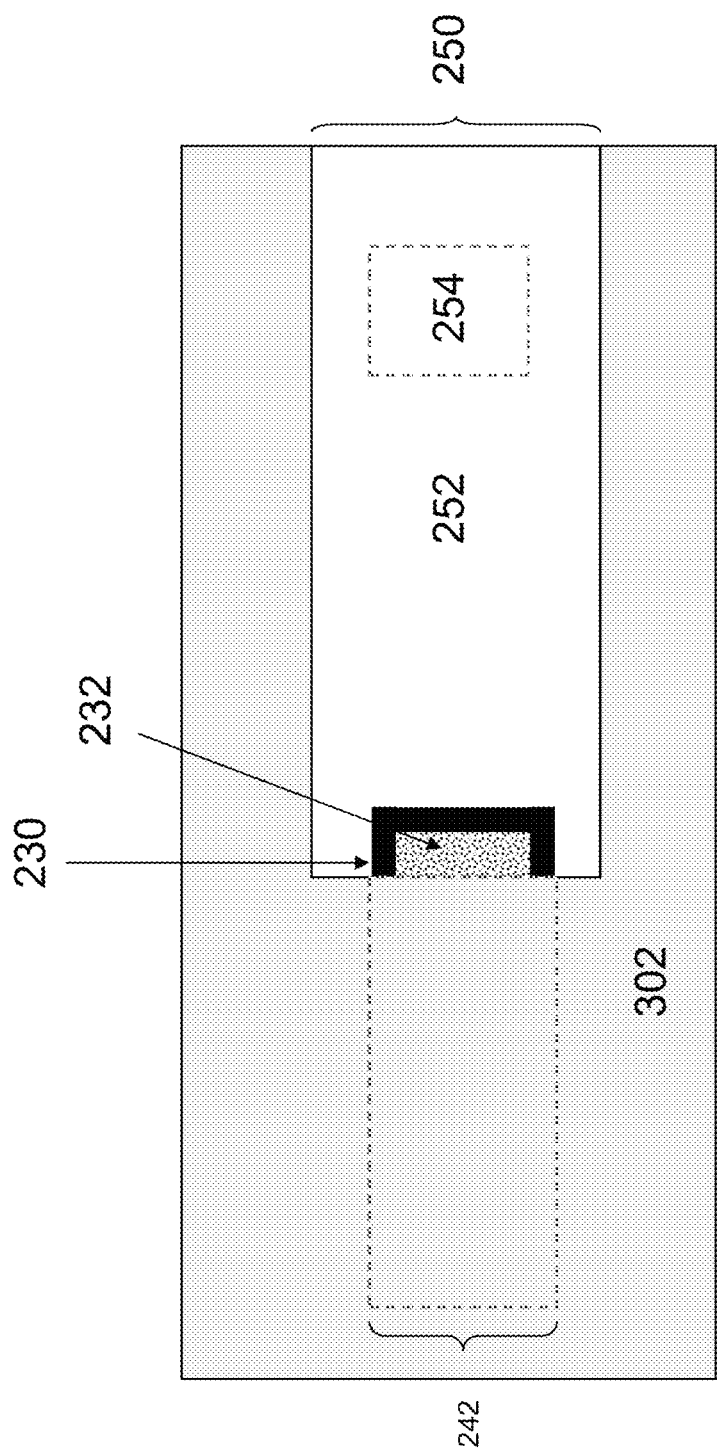
FIG. 5 is a top down illustration of first conductor and second interconnect opening according to an embodiment of the present invention.

FIG. 5 is a top down view of FIG. 4. The dotted line on the left represents first line portion 242 under the line hardmask 302. The dotted line on the right represents second via opening 254 of the second opening 250. Note that the embodiment illustrated in FIG. 5 has a second line opening 252 wider than first line portion 242.

Figure 6:
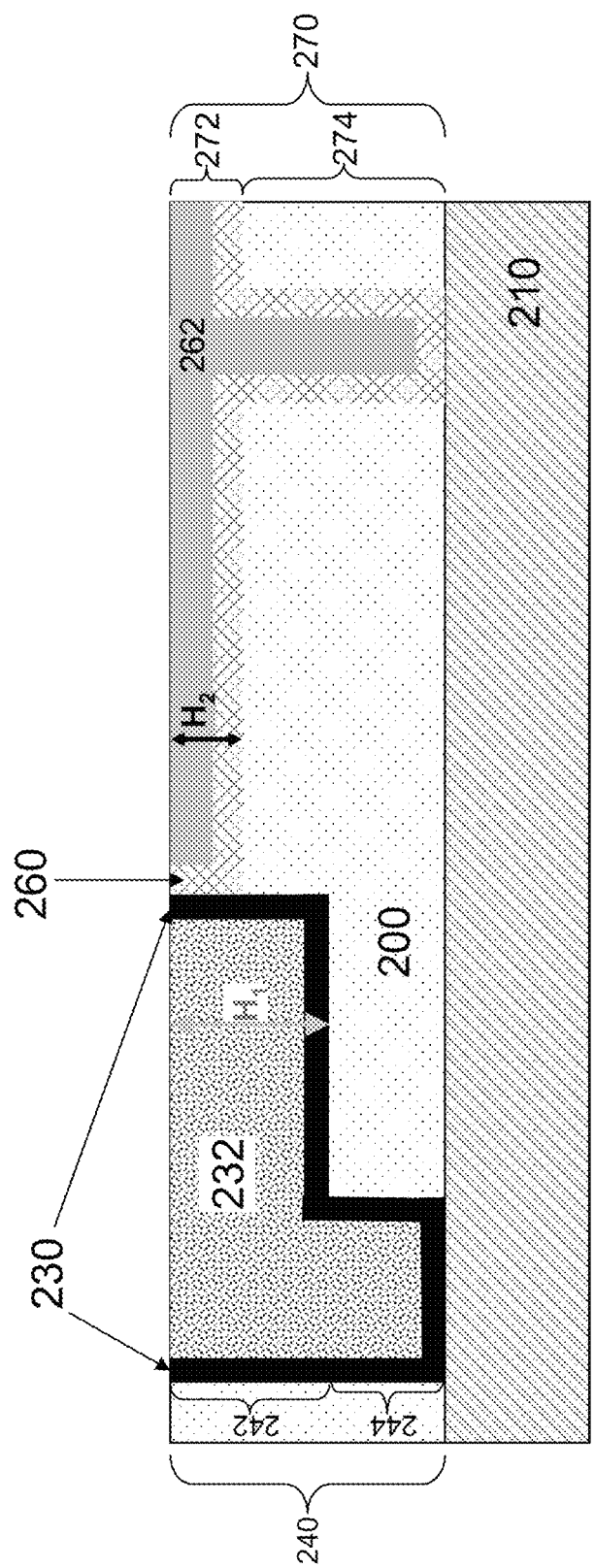
FIG. 6 illustrates, in cross section, lining, filling and planarizing the second liner and second conductor in the dielectric to form the second interconnect according to an embodiment of the present invention.

FIG. 6 is a cross section illustration after lining, filling and planarizing the second liner 260 and second conductor 262 in the second opening of dielectric 200 to form the second interconnect 270. The second interconnect 270 includes a second line 272 portion (former second line opening 252) and a second via 274 portion (former second via opening 254). The second liner 260 lines the former second line opening 252 and second via opening 254 and is in contact with dielectric 200, substrate 210, and first liner 230. The second liner 260 can comprise one or more layers. The second liner 260 should perform at least one of the following functions: promote adhesion of the dielectric 200 and second conductor 262, and should prevent diffusion from the second conductor 262 to the dielectric 200 or vice versa. Thus, the identity of the second liner 260 can vary with the identity of the second conductor 262. In a preferred embodiment, the second liner includes a tantalum nitride layer and a tantalum layer. Other liner materials in lieu or in addition to preferred materials include but are not limited to manganese containing layers, aluminum containing layers, ruthenium containing layers or cobalt containing layers. The second conductor 262 is a low resistivity metal or metal alloy in comparison to the first conductor 232. In a preferred embodiment, the second conductor includes copper or copper doped with another metal, for example, but not limitation, manganese, aluminum, cobalt or ruthenium.

Referring to FIG. 6, during planarization of the second interconnect 270, the first interconnect 240 is at least partially covered by line hardmask 302 in a preferred embodiment, or by the second liner 260 in embodiments not using a line hardmask 302. Thus, galvanic exposure of the first interconnect 240 is minimized. Optionally, to further minimize galvanic corrosion of the first interconnect 240, the second liner 260 may be removed by a dry etch, for example RIE, rather than a polish in a slurry. Thus, in some embodiments, second liner 260 may be removed in a non-aqueous environment to avoid the possibility of galvanic corrosion. In a preferred embodiment, the planarization process removes most or all of hardmask 202, thus FIG. 6 illustrates a preferred embodiment in which the interconnects are co-planar with dielectric layer 200, rather than co-planar with any remaining hardmask 202.

Still referring to FIG. 6, as mentioned earlier with respect to FIG. 4, a top corner of first line portion 242 adjacent the second line 272 may be faceted. While the faceting is not shown in FIG. 6, it will be appreciated, that the faceting may result in second liner 260 being in contact with not only first liner 230, but also in contact with a first conductor 232.

Again referring to FIG. 6, a preferred embodiment is shown in which the height ($H_1$) of the first line 242 is greater than the height ($H_2$) of the second line 272. It is also contemplated that the first and second lines, 242 and 272 respectively, have the same height. In either of these embodiments (equal heights or varying heights), the lines are substantially co-planar. Note, that in another embodiment contemplated wherein the first line and second line are on different levels (Mx and Mx+1, respectively, for example), the first and second lines will not be co-planar with each other, but will be co-planar with other metal lines in their respective levels.

Being able to independently control the heights of the first 242 and second 272 lines is a source of a distinct advantage of the present invention: the ability to tune resistance and any associated voltage drop. With respect to resistance, the first line 242 is narrower than the second line 272, and the first line is preferably made of tungsten, a higher resistivity material than copper (the conductor of the second line 272). Accordingly, if the lines had the same height, the first line 242 would have higher resistance than the second line 272, and, resistive circuit delay may be introduced. However, because the height ($H_1$) of the first line 242 is independent of the height ($H_2$) of the second line 272, the first height ($H_1$) can be larger and thus the resistance of the first line 242 reduced. Thus, any signal delay caused by using a high resistivity material in a narrow line is mitigated. Voltage drop is also affected by the choice of materials, line widths and line heights in an analogous manner.

Figure 7:
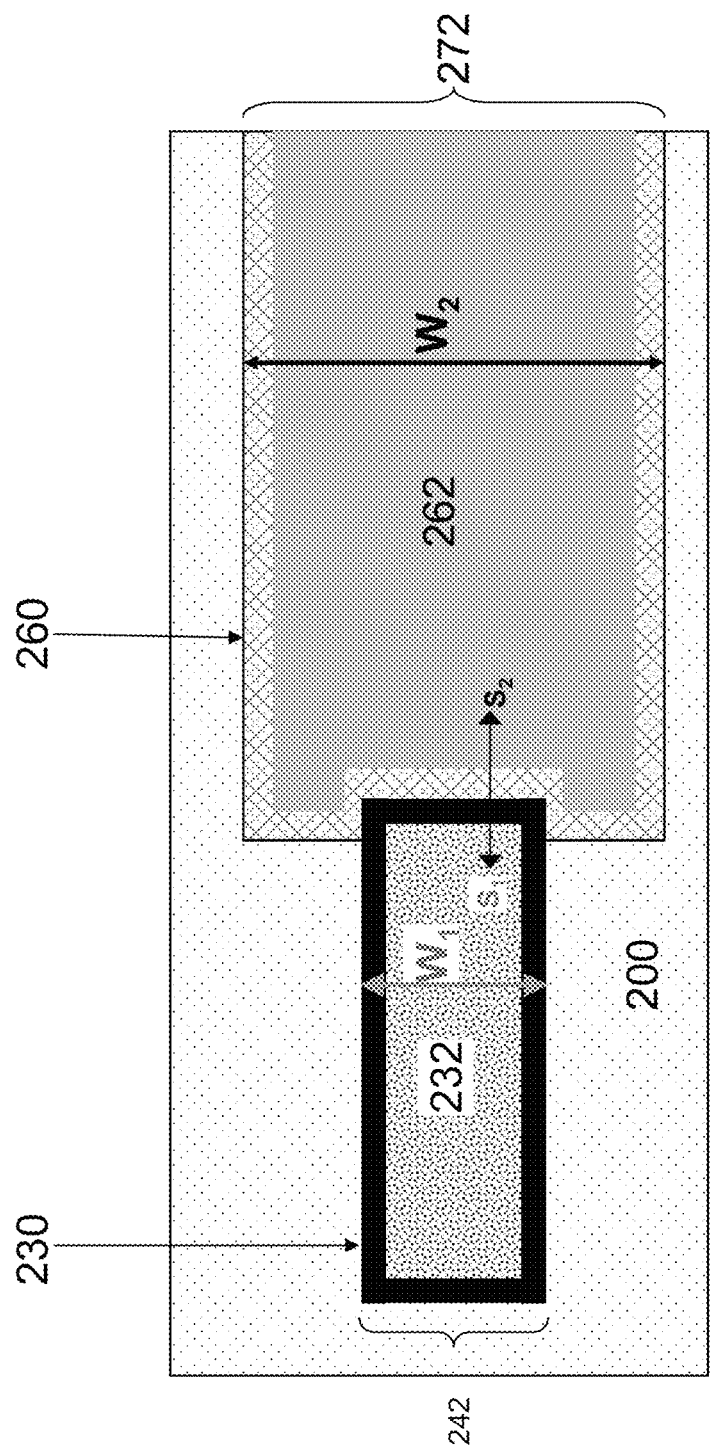
FIG. 7 is a top down illustration of first conductor and second conductor according to an embodiment of the present invention.

Referring to FIG. 7, a preferred embodiment is shown in which the width ($W_1$) of the first line 242 is less than the width ($W_2$) of the second line 272. Thus, the first line 242 and second line 272 can have independent aspect ratios even though they exist in the same dielectric 200 (i.e. are in the same metal level). Furthermore, when the lines have different and independent aspect ratios, the first and second vias (244 and 274, respectively) will also have different aspect ratios which are independent of each other despite being in the same metal level.

Generally speaking, narrow lines which are candidates for the refractory metal first conductor material 232 are lines having a width of equal to or less than about 40 nm, 35 nm, 30 nm, 25 nm, 20 nm, 15 nm, 10 nm, and 5 nm and widths there between. In one embodiment, line widths which are candidates for the refractory metal first conductor 232 are lines that are less than three times the minimum lithographic width for that node, whereas low resistivity second conductors 262 are lines that are greater than or equal to three times the minimum line width for that node. In another embodiment, line widths which are candidates for the refractory metal first conductor 232 are lines that are less than two times the minimum lithographic width for that node, whereas low resistivity second conductors 262 are lines that are greater than or equal to two times the minimum line width for that node. In a preferred embodiment, line widths which are candidates for the refractory metal first conductor 232 are lines that are equal to the minimum lithographic width for that technology node, whereas low resistivity second conductors 262 are lines that are greater than or equal to three times the minimum line width for that node. Table 1 below is an example of expected minimum line widths at each node.

TABLE 1

Line widths by node

| Technology node (nm) | Minimum width line (nm) | 3x width line (nm) | Pitch (nm) |
|---|---|---|---|
| 22 | 40 | 120 | 80 |
| 14 | 32 | 96 | 64 |
| 10 | 22 | 66 | 44 |
| 7 | 16 | 48 | 32 |
| 5 | 11 | 33 | 22 |

Referring again to FIG. 7, the second line 272 is aligned such that a portion of second line 272 wraps around an end of first line 242. Thus, in this embodiment, second liner 260 and first liner 230 contact each other on three sides of first line 242. The overlap is possible because first conductor/liner 232/230 is able to withstand the reactive ion etching used to create second opening 250. It is also possible that the overlap of first and second lines, 242 and 272 respectively, results in the two lines abutting each other rather than partial wrapping shown in FIG. 7. In either case, a line can be drawn ($s_1$ to $s_2$) that traces the materials where the two lines meet. Starting at point $s_1$ in FIG. 7 and moving to point $s_2$ the first material encountered is first conductor 232, followed by first liner 230, second liner 260 and second conductor 262. Thus, in a preferred embodiment, the materials from $s_1$ to $s_2$ are a refractory metal such as tungsten as first conductor 232, titanium nitride followed by titanium layers as first liner 230, tantalum nitride followed by tantalum as second liner 260 and copper or a copper alloy as a low resistivity second conductor 262. It should be noted that the second conductor 262 may be capped with a metallic layer, for example if the second conductor is copper or a copper alloy it may be capped with CoWP, CuMn, CuAl or other metallic caps which preferably inhibit electromigration flow.

Referring back to FIG. 6, the first line 242 and second line 272 occupy the same level in a back end of line structure (i.e. they are both Mx lines where x=1, 2, 3 . . . ), and this is the preferred embodiment: narrow lines of one material (refractory) and wide lines of the same level with another (lower resistivity) material. However, it is also contemplated that narrow lines and wide lines at different levels have different conductor materials. For example, lower level lines are typically narrower than higher level lines, accordingly, a lower level may have substantially all refractory metal lines, while an upper level line has a mix of refractory and low resistivity metal lines (which may or may not contact each other within the same line level), while still an uppermost level line may be all low resistivity line.

Figure 8:
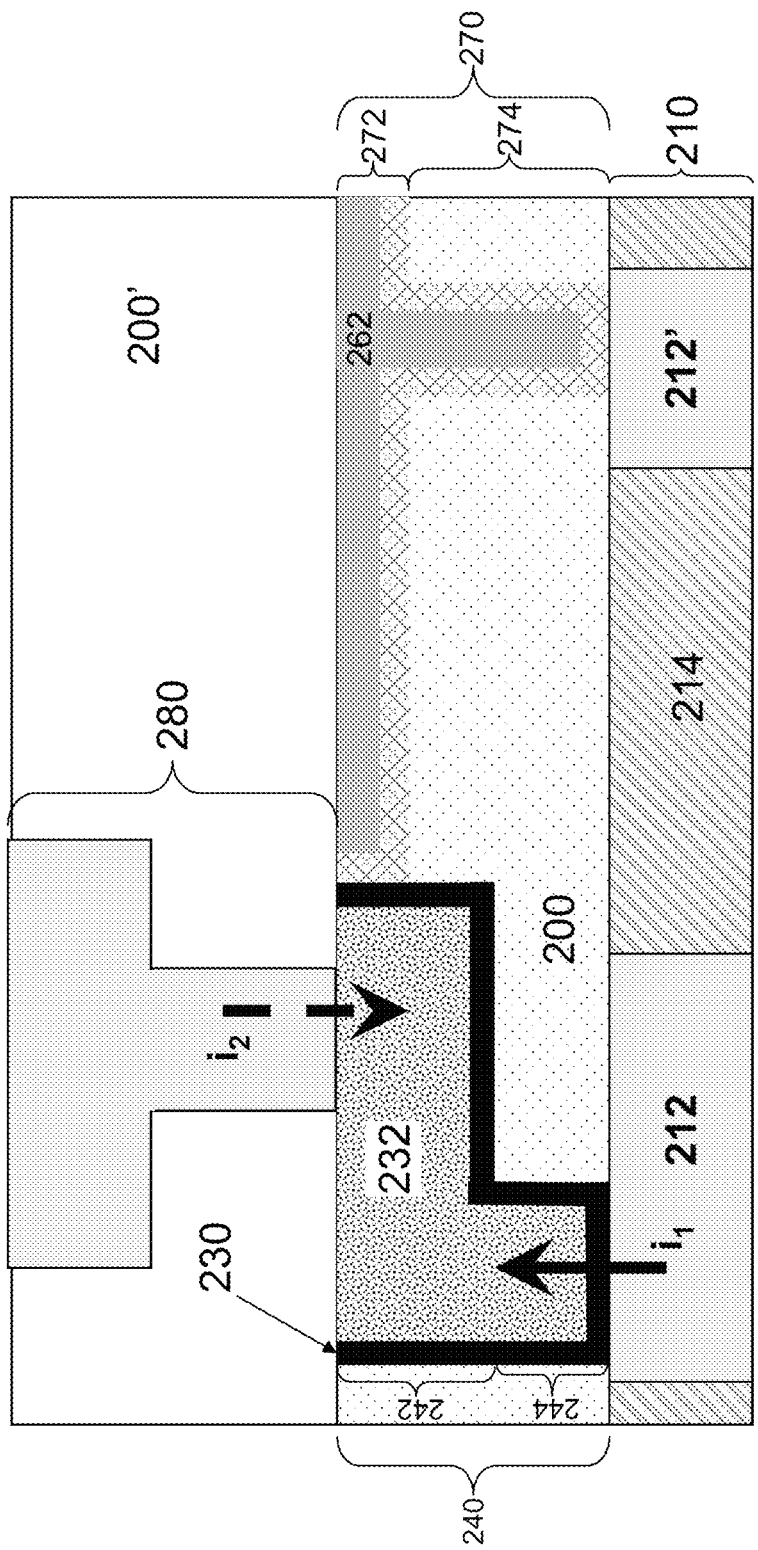
FIG. 8 illustrates, in cross section, structure having three levels of interconnects according to an embodiment of the present invention.

Referring to FIG. 8, the via and line depletion advantage of the present invention will be discussed. FIG. 8 illustrates the hybrid metallization of FIG. 6 wherein the substrate 210 includes a lower level dielectric 214 and conductors 212 and 212' ($M_{x-1}$ line level). One of the lower level conductors 212 is in contact with the first via 244. FIG. 8 also includes an upper level interconnect 280 ($M_{x+1}$ level) in contact with the first line 242. The upper level interconnect 280 is embedded in a dielectric layer 200' similar to that described in conjunction with dielectric layer 200. In a first scenario, a current ($i_1$) flows from the lower level conductor 212 through the interconnect 240 and into upper level interconnect 280; accordingly, the electrons flow in the opposite direction, namely from upper level interconnect 280 through interconnect 240 to lower level conductor 212. If the first interconnect 240 was small and made of copper, line depletion would expect to take place, meaning material would move out of the line 242 of the first interconnect 240 in response to the high current density and a void would form near the line 242 under the via of the upper level interconnect 280 causing an open or increasing the resistance to create a high resistance line. Similarly, if the current came from the opposite direction ($i_2$), meaning from the upper level interconnect 280 above (accordingly, electrons moving from lower interconnect 212 through first interconnect 240 and into upper level interconnect 280), via depletion would be expected. In via depletion mode, material would move out of the via 244 of the first interconnect 240 in response to the high current density and a void would form near the via 244 causing an open or increasing the resistance to create a high resistance via. However, because the present invention uses a refractory metal in both the line 242 and the via 244 of the interconnect 240, the interconnect 240 is protected from both line depletion and via depletion.

In an alternative embodiment, the advantages of the hybrid metallization scheme described above may be exploited to produce an electronic fuse (e-fuse) having improved characteristics, for example, lower programming currents and shorter programming times.

The basic principle of the alternative embodiment includes methods of making a hybrid e-fuse structure. The methods result in structures which include a fuse region having a first region and a second region. The fuse regions being made up of a first conductor and a second conductor, preferably in the same level and co-planar with one another. The first and second conductors having a similar width and a similar height, but different lengths. Preferably, the first region is longer than the second region. The first and second conductor are in direct contact and may each be in electrical contact with one or more nearby interconnect structures.

The e-fuse is a structure that may be programmed in accordance with the application of a suitable electrical current. For example, an electrical current may be provided through the e-fuse to eventually cause the resistance of the e-fuse to exceed a predetermined threshold. A suitable electrical current depends on the e-fuse design and may range from about 10 mA to about 25 mA, and ranges there between. Alternatively, programming may occur at a threshold current density. For example, a typical current density of 1000 MA/cm$^2$ may be required to program the e-fuse. Additionally, a circuit is considered to be programmed, and open, when the e-fuse resistance increases more than an order of magnitude over the initial pre-programmed resistance of the e-fuse.

During programming of the e-fuse, one or more voids may form in unexpected locations due to non-optimized processing. Location of the voids may be uncontrollable and may affect the yield and reliability of the e-fuse. The voids may be due in part to the electromigration of conductive interconnect material within the e-fuse.

Ideally only the targeted e-fuse will be programmed while maintaining the integrity of all surrounding circuits. One embodiment by which to fabricate an e-fuse having two different conductive materials, or hybrid metallization, is described in detail below by referring to the accompanying drawings FIGS. 9-11. In the present embodiment, an e-fuse fabricated in a single metallization level may include a fuse link having at least two different conductive materials Referring now to FIG. 9, a structure 400 is shown. The structure 400 may include a substrate 402, an $M_x$ level 404, and an $M_{x+1}$ level 406. The substrate 402 may be substantially similar to the substrate 210 described above. The $M_x$ level 404 may include a first $M_x$ metal 408, a second $M_x$ metal 410, an $M_x$ dielectric layer 412, and an $M_x$ cap 414. The $M_x$ level 404 may represent any interconnect level in the structure 400. In one embodiment, the $M_x$ level 404 may represent a metallization level directly above a contact level or an active device level. The $M_{x+1}$ level 406 may include a first $M_{x+1}$ metal 416, a first $M_{x+1}$ via 418, a second $M_{x+1}$ metal 420, a second $M_{x+1}$ via 422, a fuse link 424, an $M_{x+1}$ dielectric layer 426, and an $M_{x+1}$ cap 428. It should be noted that while only two interconnect levels are shown, in some embodiments the structure 400 may have multiple interconnect levels either above, below, or above and below the $M_x$ level 404 and the $M_{x+1}$ level 406.

The $M_x$ dielectric layer 412 may be substantially similar to the dielectric layer 200 described above. In one embodiment, the $M_x$ dielectric layer 412 may include any suitable dielectric material, for example, silicon oxide ($SiO_2$), silicon nitride ($Si_3N_4$), hydrogenated silicon carbon oxide (SiCOH), silicon based low k dielectrics, or porous dielectrics. Known suitable deposition techniques, such as, for example, chemical vapor deposition, plasma enhanced chemical vapor deposition, atomic layer deposition, or physical vapor deposition may be used to form the $M_x$ dielectric layer 412. The $M_x$ dielectric layer 412 may have a typical thickness ranging from about 100 nm to about 450 nm and ranges there between, although a thickness less than 100 nm and greater than 450 nm may be acceptable.

The first and second $M_x$ metals 408, 410 may be formed using any known technique, and may include any suitable conductive interconnect material, for example, copper. Both the first and second $M_x$ metals 408, 410 may include a typical line or wire found in a typical semiconductor circuit. The first and second $M_x$ metals 408, 410 may be substantially similar structures and may be fabricated using, for example, a typical single damascene technique in which a conductive interconnect material may be deposited in a trench formed in the $M_x$ dielectric layer 412.

In one embodiment, the first and second $M_x$ metals 408, 410 may include various barrier liners (not shown). One barrier liner may include, for example, tantalum nitride (TaN), followed by an additional layer including tantalum (Ta). One barrier liner may include, for example, titanium (Ti), followed by an additional layer including titanium nitride (TiN). Other barrier liners may include cobalt (Co) or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material.

Figure 9:
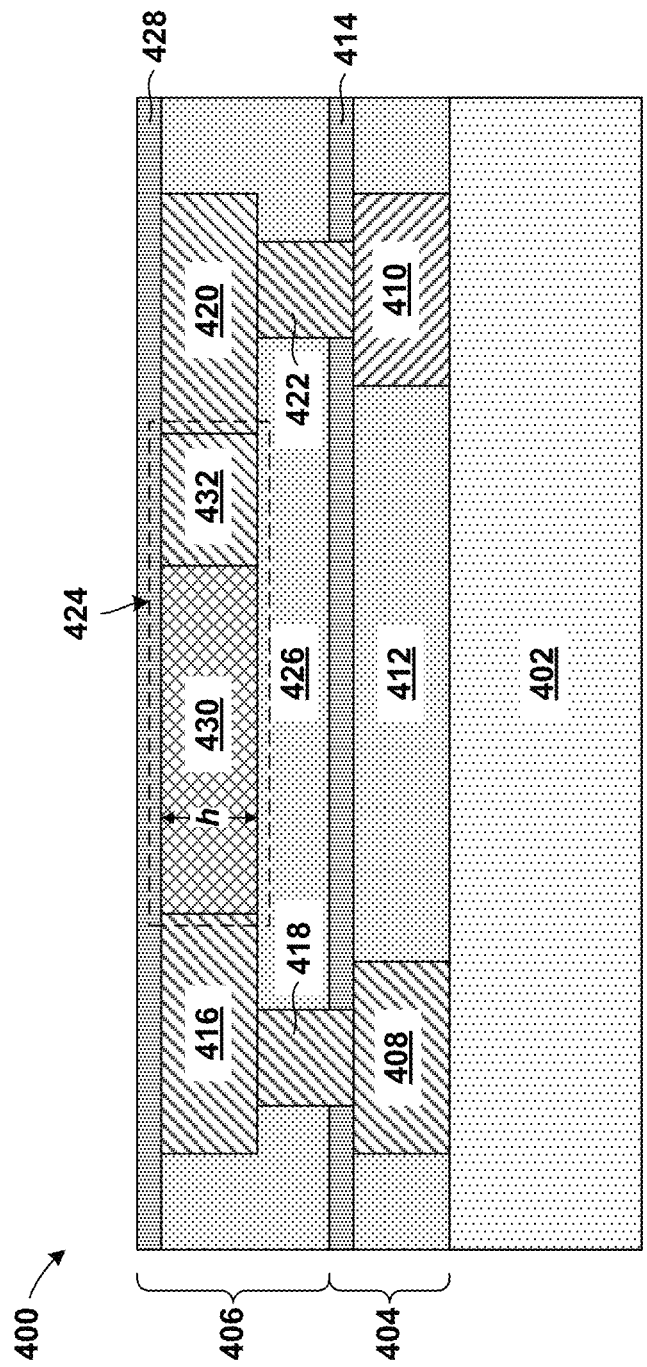
FIG. 9 illustrates, in cross section, the formation of an e-fuse having hybrid metallization according to an embodiment of the present invention.

With continued reference to FIG. 9, the $M_x$ cap 414 may be deposited over the structure 400. The $M_x$ cap 414 may electrically insulate the $M_x$ level 404 from additional interconnect levels that may be subsequently formed above the $M_x$ level 404, for example the $M_{x+1}$ level 406. The $M_x$ cap 414 may be used to improve interconnect reliability and prevent copper from diffusing into an $M_{x+1}$ dielectric that may be subsequently formed above. The $M_x$ cap 414 may be deposited using typical deposition techniques, for example, chemical vapor deposition. The $M_x$ cap 414 may include any suitable dielectric material, for example, silicon nitride ($Si_3N_4$), silicon carbide (SiC), silicon carbon nitride (SiCN), hydrogenated silicon carbide (SiCH), or other known capping materials. The $M_x$ cap 414 may have a thickness ranging from about 15 nm to about 55 nm and ranges there between, although a thickness less than 15 nm and greater than 55 nm may be acceptable.

Next, the $M_{x+1}$ level 406 may be formed above the $M_x$ level 404. First, the $M_{x+1}$ dielectric 426 may be deposited. The $M_{x+1}$ dielectric 426 may be substantially similar in all respects to the $M_x$ dielectric layer 412 described above.

The fuse link 424 may be formed in accordance with the techniques described above with reference to FIGS. 1-7. In the present embodiment, the fuse link 424 may have a first region 430 and a second region 432. It should be noted that the first region 430 may correspond with the first interconnect 240 (FIG. 6), and the second region 432 may correspond with the second interconnect 270 (FIG. 6). More specifically, the first region 430 may be substantially similar to the first interconnect 240 (FIG. 6), and the second region 432 may be substantially similar to the second interconnect 270 (FIG. 6).

A first trench may be formed in the $M_{x+1}$ dielectric 426. The first trench may then be filled with a conductive interconnect material substantially similar to the first conductor 232 (FIG. 3) described above. In one embodiment, tungsten may be deposited in the first trench using any known deposition technique. In another embodiment, tungsten silicide may be deposited in the first trench using any known deposition technique.

In one embodiment, the first region 430 of the fuse link 424 may include various barrier liners (not shown) similar to the barrier liners described above with reference to the first and second $M_x$ metals 408, 410. Furthermore, a seed layer (not shown) may optionally be deposited, as described above, prior to filling the first trench with the refractory metal or the metal silicide. A chemical mechanical polishing technique may be applied to ensure complete removal of excess conductive interconnect material prior to forming the second region 432 of the fuse link 424 or any surrounding interconnect structures.

Next, a second trench may be formed in the $M_{x+1}$ dielectric 426 adjacent to the first region 430 of the fuse link 424. The second trench may at least partially overlap the first region 430 of the fuse link 424. One or more dual damascene openings may be formed in the $M_{x+1}$ dielectric 426 adjacent to the fuse link 424. In one embodiment, one dual damascene opening may be formed adjacent to the first region 430 of the fuse link 424, and another dual damascene opening may be formed adjacent to the second trench opening, or the second region 432 of the fuse link 424.

Either of the dual damascene openings may include a trench opening and a via opening. The dual damascene openings may be formed using any suitable masking and etching technique known in the art, including either a trench first technique or a via first technique. In one embodiment, a dry etching technique using a fluorine based etchant, such as, for example $C_xF_y$, may be used. The trench openings may be any size and shape suitable for the formation of any BEOL interconnect structure so desired.

More specifically, the via openings may extend vertically from a bottom of the trench openings to a top of either the first $M_x$ metal 408 or the second $M_x$ metal 410. In one embodiment, one dual damascene opening may be formed above the first $M_x$ metal 408 and another dual damascene opening may be formed above the second $M_x$ metal 410, as illustrated in the figures. The first and second $M_x$ metal 408, 410 may preferably be exposed by the formation of the dual damascene openings, more specifically, by the formation of the via openings.

Both the second trench opening and the dual damascene openings may then be filled with a conductive interconnect material, or conductor, to form the second region 432 of the fuse link 424 and to form the first $M_{x+1}$ metal 416, the first $M_{x+1}$ via 418, the second $M_{x+1}$ metal 420, and the second $M_{x+1}$ via 422. The conductive interconnect material may be substantially similar to that described above with reference to the first and second $M_x$ metals 408, 410. In one embodiment, the conductive interconnect material of the second region 432 of the fuse link 424, the first $M_{x+1}$ metal 416, the first $M_{x+1}$ via 418, the second $M_{x+1}$ metal 420, and the second $M_{x+1}$ via 422 may be copper.

In one embodiment, the second region 432 of the fuse link 424, the first $M_{x+1}$ metal 416, the first $M_{x+1}$ via 418, the second $M_{x+1}$ metal 420, and the second $M_{x+1}$ via 422 may include various barrier liners (not shown) similar to the barrier liners described above with reference to the first and second $M_x$ metals 408, 410. Furthermore, a seed layer (not shown) may optionally be deposited, as described above, prior to filling the trench openings and via openings with the conductive interconnect material. After filling the first $M_{x+1}$ metal 416, the first $M_{x+1}$ via 418, the second $M_{x+1}$ metal 420, and the second $M_{x+1}$ via 422 with the conductive interconnect material the $M_{x+1}$ cap 428 may be deposited on top of the structure 400. A chemical mechanical polishing technique may be applied to ensure complete removal of excess conductive interconnect material prior to depositing the $M_{x+1}$ cap 428. The $M_{x+1}$ cap 428 may be substantially similar to the $M_x$ cap 414 described above.

Vias, generally, may be used to form electrical connections between the metallization of two interconnect levels. The via 418 may extend vertically from the first $M_x$ metal 408 to the first $M_{x+1}$ metal 416, and the via 422 may extend vertically from the second $M_x$ metal 410 to the second $M_{x+1}$ metal 420.

Generally, the first $M_{x+1}$ via 418 and the second $M_{x+1}$ via 422 may have a width or diameter of a typical via opening formed in the BEOL. In one embodiment, the first $M_{x+1}$ via 418 and the second $M_{x+1}$ via 422 may have an aspect ratio of about 4:1 or more, and a diameter or width ranging from about 10 nm to about 100 nm and ranges there between, although a via diameter less than 10 nm and greater than 100 nm may be acceptable.

Figure 10:
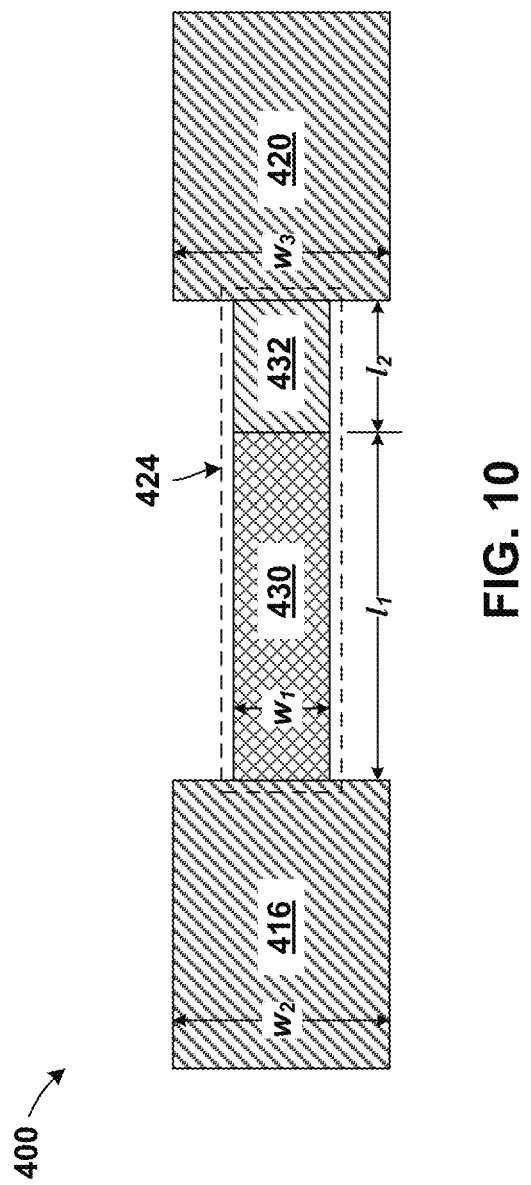
FIG. 10 is a top down view of FIG. 9 according to an embodiment of the present invention.

Referring now to FIG. 10, and with continued reference to FIG. 9, alternative embodiments will now be described. FIG. 10 is a top view of FIG. 9. Both the first region 430 and the second region 432 of the fuse link 424 may preferably have the same width, but different lengths ($l_1$, $l_2$). The total length of the fuse link 424 may be equal to the length ($l_1$) of the first region 430 plus the length ($l_2$) of the second region 432. In one embodiment, the total length of the fuse link 424 may range from about 0.5 μm to about 5.0 μm. The length ($l_1$) of the first region 430 of the fuse link 424 may range from about 70% to about 80% of the total length ($l_1+l_2$) of the fuse link 424.

The first region 430 and the second region 432, of the fuse link 424, may have a width ($w_1$) equal to that of a typical interconnect structure. In one embodiment, the first region 430 and the second region 432, of the fuse link 424, may have a width ($w_1$) ranging from about 5 nm to about 40 nm. Furthermore, the width ($w_1$) of the first and second regions 430, 432 of the fuse link 424 may be less than a width ($w_2$) of the first $M_{x+1}$ metal 416 or a width ($w_3$) of the second $M_{x+1}$ metal 420. Additionally, the first region 430 and the second region 432, of the fuse link 424, may have a height (h) or vertical thickness equal to that of a typical interconnect structure. In one embodiment, the first region 430 and the second region 432, of the fuse link 424, may have a height (h) ranging from about 25 nm to about 100 nm.

With continued reference to FIGS. 9 and 10, a final e-fuse structure is shown according to one embodiment. Therefore, the first $M_{x+1}$ metal 416, the second $M_{x+1}$ metal 420, and the fuse link 424 may together form the final e-fuse structure. The first and second $M_{x+1}$ metals 416, 420 may include any active interconnect structure in the BEOL. In the present embodiment, electrical connection to the e-fuse is provided by the first $M_{x+1}$ via 418 and the second $M_{x+1}$ via 422. The e-fuse structure as depicted in the figures may effectively lower the require programming current and shorten the programming time, thereby increasing programming reliability and efficiency.

In the present embodiment, the fuse link 424 may be fabricated with two different conductive materials, one having better electromigration characteristics than the other. Therefore, the e-fuse, and more specifically the fuse link 424, may be fabricated specifically to exploit the different electromigration behavior between the first region 430 and the second region 432.

In one embodiment, the first region 430 may be made from a refractory metal, such as, for example, tungsten, and the first $M_{x+1}$ metal 416, the first $M_{x+1}$ via 418, the second $M_{x+1}$ metal 420, the second $M_{x+1}$ via 422, and the second region 432 may be made from copper. In another embodiment, the first region 430 may be made from a metal silicide, such as, for example, tungsten silicide, and the first $M_{x+1}$ metal 416, the first $M_{x+1}$ via 418, the second $M_{x+1}$ metal 420, the second $M_{x+1}$ via 422, and the second region 432 may be made from copper. Generally, refractory metals and metal silicides have a high electromigration tolerance, and thus a high resistance to the effects of electromigration. In any case, refractory metals and metal silicides, in general, may have more resistance to the effects of electromigration than copper.

Figure 11:
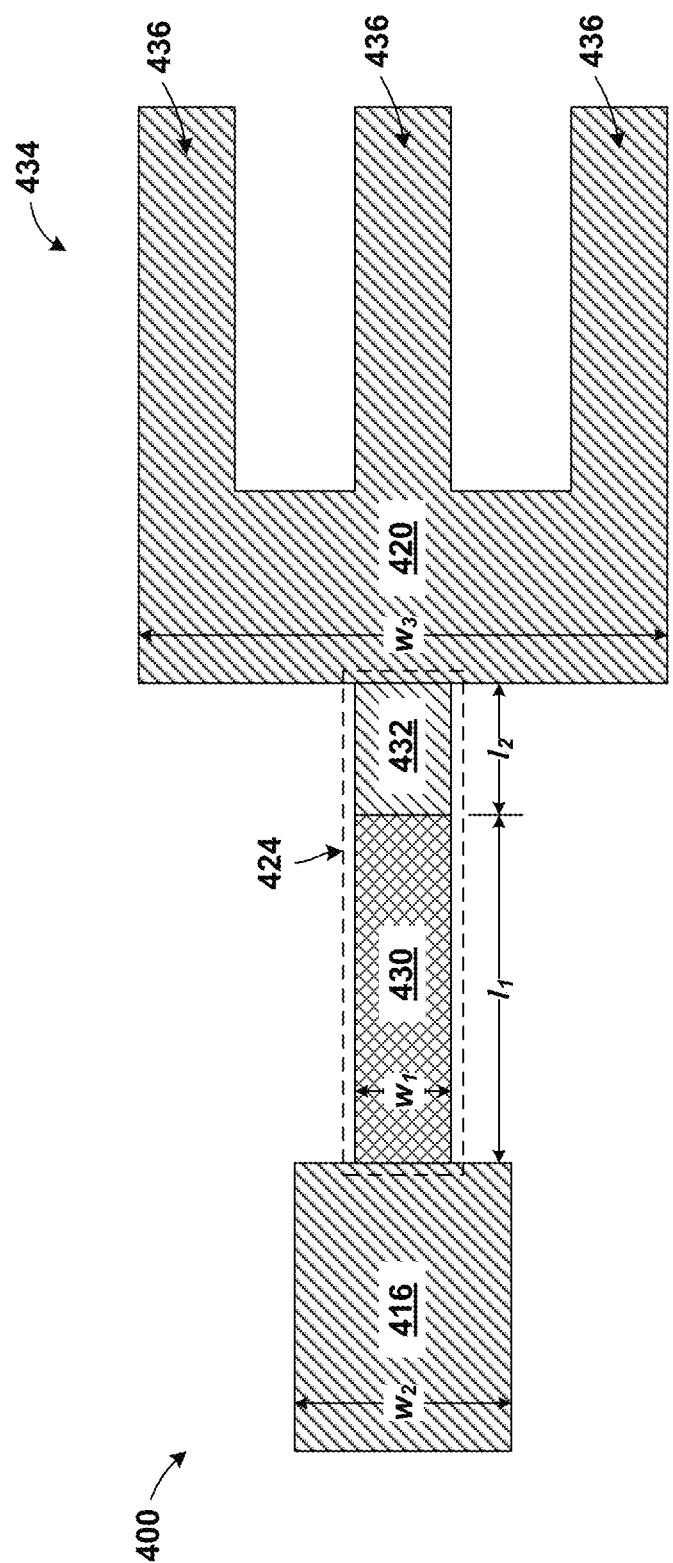
FIG. 11 is a top down view of FIG. 9 according to an alternate embodiment of the present invention.

Referring now to FIG. 11, a final e-fuse structure is shown according to another embodiment. FIG. 11 is a top view of the structure 400 of FIG. 9 according to an alternative embodiment. The present embodiment, unlike the embodiment described above and illustrated in FIGS. 9 and 10, illustrates an asymmetric e-fuse design. The asymmetric e-fuse structure of the present embodiment may include the first $M_{x+1}$ metal 416, the second $M_{x+1}$ metal 420, and the fuse link 424. The asymmetric e-fuse structure of the present embodiment contemplates using two different metal shapes on either end of the fuse link 424, as illustrated in the figure. For example, the first $M_{x+1}$ metal 416 and the second $M_{x+1}$ metal 420 have different shapes. In the present embodiment, the first $M_{x+1}$ metal 416 may have a shape of a typical interconnect structure, but the second $M_{x+1}$ metal 420 may have a different shape designed to have smaller grains and therefore more grain boundaries. For example a finger shape 434, as illustrated, may be used to achieve smaller grains, and more grain boundaries due in part to the narrow finger configuration (e.g. 436). More grain boundaries in the narrow finger regions 436 may enhance the effects of electromigration. As such, the finger regions 436 of the second $M_{x+1}$ metal 420 may induce or encourage the electromigration of copper from the second region 432 of the fuse link 424 into the second $M_{x+1}$ metal 420. It should be noted that any suitable shape that may increase the number of grain boundaries is contemplated, and may be used to enhance the effects of electromigration.

The embodiments disclosed herein have the capability to improve the failure mechanism of the e-fuse structure by lowering the programming current and reducing the programming times. In turn, lowering the programming current and reducing the programming time effectively improves the reliability and efficiency of the e-fuse structure.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims including single damascene lines. The scope of the following claims is to be accorded the broadest interpretation so as to encompass all such modifications and equivalent structures and functions.

What is claimed is:

1. A structure comprising:
a first interconnect including a first line overlying a first via; and
a second interconnect including a second line overlying a second via;
wherein a top surface of the first line and a top surface of the second line are coplanar;
wherein the first interconnect comprises a first conductor and a first liner, the first conductor comprises a metal silicide including titanium silicide, cobalt silicide, nickel silicide, tungsten silicide, platinum silicide, molybdenum silicide, tantalum silicide, or a combination thereof; and
wherein the second interconnect comprises a second conductor and a second liner, the second conductor comprising copper, the first conductor and the second conductor are separated by both the first liner and the second liner such that a distance between the first conductor and the second conductor is equal to a wall thickness of the first liner plus a wall thickness of the second liner.

2. The structure of claim 1, wherein the first and second lines are in electrical contact with each other.

3. The structure of claim 1, wherein the first liner and second liner are in physical contact with each other.

4. The structure of claim 1, wherein the first line has a width less than a width of the second line.

5. The structure of claim 1, wherein the first line has a width less than about 22 nm.

6. The structure of claim 1, wherein the first line has a height greater than a height of the second line.

7. The structure of claim 1, wherein an aspect ratio of the first line is greater than an aspect ratio of the second line.

8. The structure of claim 1, wherein the second conductor has a resistivity less than a resistivity of the first conductor.

9. A method of forming a hybrid structure comprising:
forming a first opening in a dielectric, the first opening including a first line opening in communication with a first via opening;
lining the first opening with a first liner;
filling the first opening with a first conductor, the first conductor comprises a metal silicide including titanium silicide, cobalt silicide, nickel silicide, tungsten silicide, platinum silicide, molybdenum silicide, tantalum silicide, or a combination thereof;
planarizing the first conductor and first liner to be co-planar with the dielectric;
forming a second opening in the dielectric while protecting at least a portion of the first conductor and at least a portion of the frist liner with a line hardmask, the second opening including a second line opening in communication with a second via opening;
lining the second opening with a second liner;
filling the second line opening and the second via opening with a second conductor, the second conductor comprising copper; and
planarizing the second conductor and second liner to be co-planar with the dielectric, the first conductor, and the first liner; the first conductor and the second conductor are separated by both the first liner and the second liner such that a distance between the first conductor and the second conductor is equal to a wall thickness of the first liner plus a wall thickness of the second liner.

10. The method of claim 9, wherein the second line opening is in communication with the first line opening.

11. The method of claim 9, wherein the first line opening has a first line height and the second line opening has a second line height wherein the first line height is greater than the second line height.

12. The method of claim 11, wherein first line height is at least 1.5 times greater than the second line height.

13. The method of claim 9, wherein lining the second opening with the second liner includes forming a portion of the second liner in contact with a portion of the first liner.

14. The method of claim 9, wherein the first line opening has a first line width and the second line opening has a second line width wherein the first line width is less than the second line width.

15. The method of claim 14, wherein the second line width is at least two times greater than the first line width.

16. A method of forming a hybrid interconnect structure comprising:
forming a first damascene line of a first conductor, the first damascene line having a first line width, the first conductor comprises a metal silicide including titanium silicide, cobalt silicide, nickel silicide, tungsten silicide, platinum silicide, molybdenum silicide, tantalum silicide, or a combination thereof; and forming a second damascene line of a second conductor, the second damascene line having a second line width, the second conductor comprising copper;

wherein the first line width is less than the second line width, and wherein the first conductor and the second conductor are separated by both a first liner and a second liner such that a distance between the first conductor and the second conductor is equal to a wall thickness of the first liner plus a wall thickness of the second liner.

* * * * *